United States Patent [19]
Reinhardt et al.

[11] Patent Number: 5,224,165
[45] Date of Patent: Jun. 29, 1993

[54] HIGH SPEED WORD GENERATOR

[75] Inventors: Victor S. Reinhardt; Clinton Lew, both of Rancho Palos Verdes, Calif.

[73] Assignee: Hughes Aircraft Company, Los Angeles, Calif.

[21] Appl. No.: 564,005

[22] Filed: Aug. 7, 1990

Related U.S. Application Data

[63] Continuation-in-part of Ser. No. 262,543, Oct. 25, 1988, abandoned.

[51] Int. Cl.[5] .......................... G06F 1/02; H03B 29/00
[52] U.S. Cl. ......................................... 380/47; 380/46; 364/717; 331/78
[58] Field of Search ............... 364/717, 200, 900; 380/46, 47; 331/78

[56] References Cited

U.S. PATENT DOCUMENTS

| | | | |
|---|---|---|---|
| 3,920,894 | 11/1975 | Shirley et al. | 380/46 |
| 4,179,399 | 11/1979 | Hoffmann et al. | 364/717 |
| 4,264,781 | 4/1981 | Oosterbaan et al. | 380/46 |
| 4,327,419 | 4/1982 | Deutsch et al. | 364/717 |
| 4,355,366 | 10/1982 | Porter | 364/717 |
| 4,379,206 | 4/1983 | Aoki | 380/47 |
| 4,493,046 | 1/1985 | Watanabe | 364/717 |
| 4,535,466 | 8/1985 | Palvolgyi | 364/717 |
| 4,785,410 | 11/1988 | Hamatsu et al. | 364/717 |
| 4,799,259 | 1/1989 | Ogrodski | 380/46 |
| 4,845,654 | 7/1989 | Harada et al. | 364/717 |
| 4,928,310 | 5/1990 | Goutzoulis et al. | 380/46 |

FOREIGN PATENT DOCUMENTS 1141409A 2/1985 U.S.S.R. ............... 364/717

OTHER PUBLICATIONS

IEEE Trans. on Comp. (Jun. 1972) pp. 614–615, Sokal, "Optimum Choice of Noise Frequency Band and Sampling Rates for Generating Random Binary Digits from Clipped White Noise".
Electronics World, Nov. 1962, pp. 40–42, Edwards, "White Noise, Its Nature, Generation and Applications".

*Primary Examiner*—Bernarr E. Gregory
*Attorney, Agent, or Firm*—William J. Streeter; Wanda K. Denson-Low

[57] ABSTRACT

An improved high speed word generator (30) which includes a white noise generator (12) for providing first and second bits and exclusive or (XOR) means (32) for providing an output signal which is the exclusive or of said first and second bits. In an alternative embodiment, the invention provides an improved N-bit high speed word generator including noise generator means for providing N bits, either through N one bit noise generators or one one bit noise generator and means for storing the output thereof, and exclusive or (XOR) means for providing M stages of N output signals the first stage of which provides N output signals each of which is the exclusive or of two of said bits and the subsequent stages of which provide N output signals each of which is the exclusive or of the output of the previous stage and an output of said noise generator means.

5 Claims, 4 Drawing Sheets

HIGH SPEED WORD GENERATOR

This is a continuation-in-part of an application entitled IMPROVED HIGH SPEED WORD GENERATOR, Ser. No. 07/262,543, filed Oct. 25, 1988, by Victor S. Reinhardt and Clinton Lew, now abandoned.

BACKGROUND OF THE INVENTION

1. Field of the Invention

The present invention relates to communication systems. More specifically, the present invention relates to high speed word generators used in communication systems.

While the invention is described herein with reference to illustrative embodiments for a particular application, it is understood that the invention is not limited thereto. Those of ordinary skill in the art and access to the teachings provided herein will recognize additional modifications, applications, and embodiments within the scope thereof.

2. Description of the Related Art

Devices that generate random words are widely used in communication systems. For example, in secure systems, it is desirable to protect a channel of communication from unauthorized eavesdropping. In such systems, the data may be encoded to make the transmission appear as random noise. In this application, a uniform random word generator would be useful in generating random words of a predetermined length which would fill the gaps between the data words. If the word generator is not random, but instead has patterns, it will generate spectral spurs. That is, a spectral analysis of the signal will reveal the pattern and compromise the effectiveness of the encryption scheme.

Another application for random word generators is in spread spectrum communication systems. In this case, the phase of a carrier signal is randomly modulated so that the signal is spread over a limited bandwidth and appears as noise. Again, if the random word generator has patterns, those patterns will show up on spectral analysis.

Yet another application for random word generators is found in frequency hopping systems where, for example, a random word generator may be used to change the frequency of a carrier signal. Once again, if the generator is not random, the resulting pattern may be recognized allowing an eavesdropper to lock onto the signal.

For these applications, random word (or number) generators have been used. Random word generators are generally built from random noise generators. Resistors and diodes generate noise randomly and are therefore often used for this purpose. When a dc voltage is applied to the random noise generator, the output voltage goes up and down randomly about an operating point. To generate a digital output, the simple random word generator typically includes a comparator which digitizes the output of the noise generator.

While many variations on the simple random word generator are known, most schemes suffer from dc drift. That is, the operating point of the system may shift, due to thermal or other effects, and change the output characteristic from a preferred Gaussian distribution to one favoring one state or the other. Attempts to address the problem by using ac amplifiers have been less than totally successful as the ac systems have an inherent bandwidth limitation outside of which, patterns begin to appear.

Pseudo-random generators are generators which are less than random and have some pattern or repetition rate. Pseudo-random generators with sufficiently long patterns or low repetition rates have been used with limited success for some applications. However, such generators are typically more complex and therefore costly than a random generator of comparable performance capability.

Thus, there is a need in the art for a simple high speed generator of N-bit random words with uniform probability distributions.

SUMMARY

The shortcomings illustrated by the related art are addressed by the improved high speed word generator of the present invention which in its simplest form includes a white noise generator for providing first and second bits and an exclusive or (XOR) gate for providing an output signal which is the exclusive or of the first and second bits. In an alternative embodiment, the invention provides an improved N-bit high speed word generator including white noise generator means for providing N bits, either through N one bit noise generators or one one bit noise generator, memory for storing the output thereof, and exclusive or (XOR) gates for providing M stages of N output signals. The first of the M stages provides N output signals. Each of the signals is the exclusive or of two of the bits. The subsequent stages provide N output signals. Each of these signals is the exclusive or of the output of the previous stage and an output of the white noise generator.

DESCRIPTION OF THE INVENTION

Figure 1:
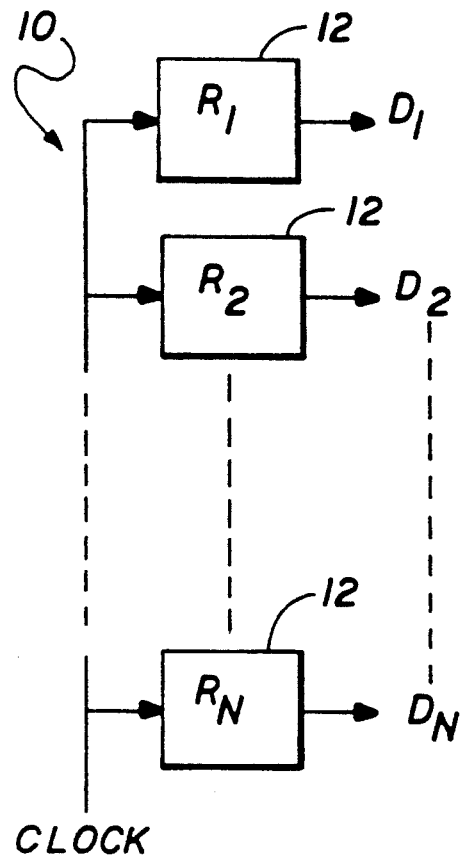
FIG. 1 shows a conventional simple high speed word generator made from N one bit white noise generators.

The present invention and the advantages afforded thereby may be illustrated with a preliminary review of the simple conventional high speed word generator 10 represented as a block diagram in FIG. 1. The conventional high speed word generator 10 includes N parallel one bit white noise generators 12 with outputs which combine to form an N bit word.

Figure 2:
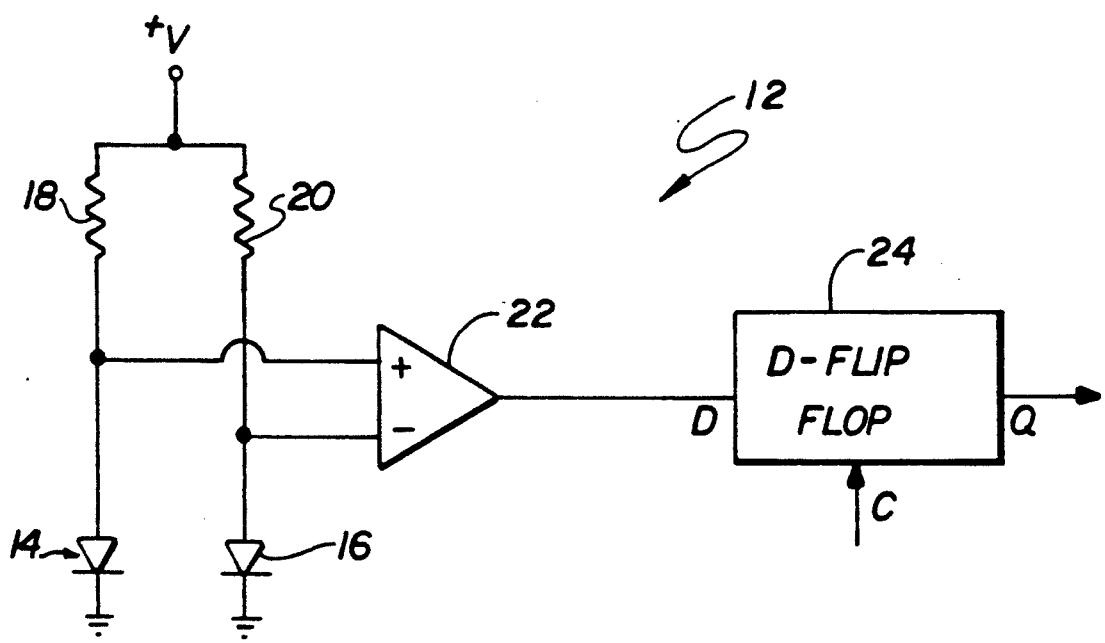
FIG. 2 shows a typical implementation of a high speed one bit white noise generator.

A typical implementation of a high speed one bit random word generator 12 is shown in FIG. 2 as including two noise diodes 14 and 16 which are biased by resistors 18 and 20 to provide a random noise voltage input to a high speed comparator 22. The diodes are often used in pair to minimize drift. That is, the diodes 14 and 16 are balanced to provide symmetrical signals into the inverting and non-inverting inputs of the differential comparator 22 so that any common offsets or asymmetries in the diodes are cancelled by the differential comparator 22. This operates to equate the probabilities that the comparator 22 will be driven to the logical 0 or logical 1 state (to the extent that the diodes are matched) independent of the common diode noise probability distributions.

The diodes may be replaced with zener diodes, resistors or other noise generating devices as is known in the art. High speed comparators 22 are available off-the-shelf e.g. LM108s. A commercially available D flip-flop may be used as a sample and hold circuit 24. For this purpose, an SN7474 or comparable device may be used. The sample and hold circuit 24 shown would receive input at 'D', a clock input at 'C' and provide an output at 'Q'.

Thus, noise randomly generated by either diode 14 or 16 will be detected and amplified by the comparator 22. The amplified output will reflect the presence of the input signal and be stored in the sample and hold circuit 24 as a generated bit. The generated bit will be clocked out of the sample and hold circuit 24 on the subsequent clock pulse. Since the comparator will have a finite bandwidth, the samples from period to period will not be completely independent. To ensure that the binary bit stream has sufficient sample-to-sample independence, for a specific application, the exact requirement for the comparator bandwidth will be determined by the requirement on the cross correlation coefficient from sample-to-sample, the nature of the comparator roll-off, and the clock period as is known in the art.

Since the latch is bistable, it also eliminates the small but finite probability that the comparator will be in a voltage state between logical 1 and 0 due to the finite voltage gain of the comparator. This process can also be accomplished by turning the comparator into a Schmidt trigger with positive feedback. In either case, a designer skilled in the art would take care to ensure that this effect did not bias the output probability distribution.

The conventional high speed word generator 10 will have a uniform probability of outputting all possible values to the degree that the individual one bit generators 12 have an equal probability of outputting logical 1's and 0's. If however, as is common, each one bit generator 12 has a probability asymmetry, d, the probability of outputting say a logical 1 would become $\frac{1}{2}+d$ and the probability of outputting a logical 0 would become $\frac{1}{2}-d$. The joint probability (i.e., the probability of all N bits being a certain value) becomes $2Nd$ and the relative probabilities of the random word values can vary by a maximum of:

$$E=(1+2d)^N-(1-2d)^N\approx 4Nd.$$

Thus, as N, the word length, becomes large, the need to reduce the probability asymmetry d increases. The present invention provides a high speed word generator with means for reducing the sensitivity to one bit probability asymmetry.

Figures 3, 4:
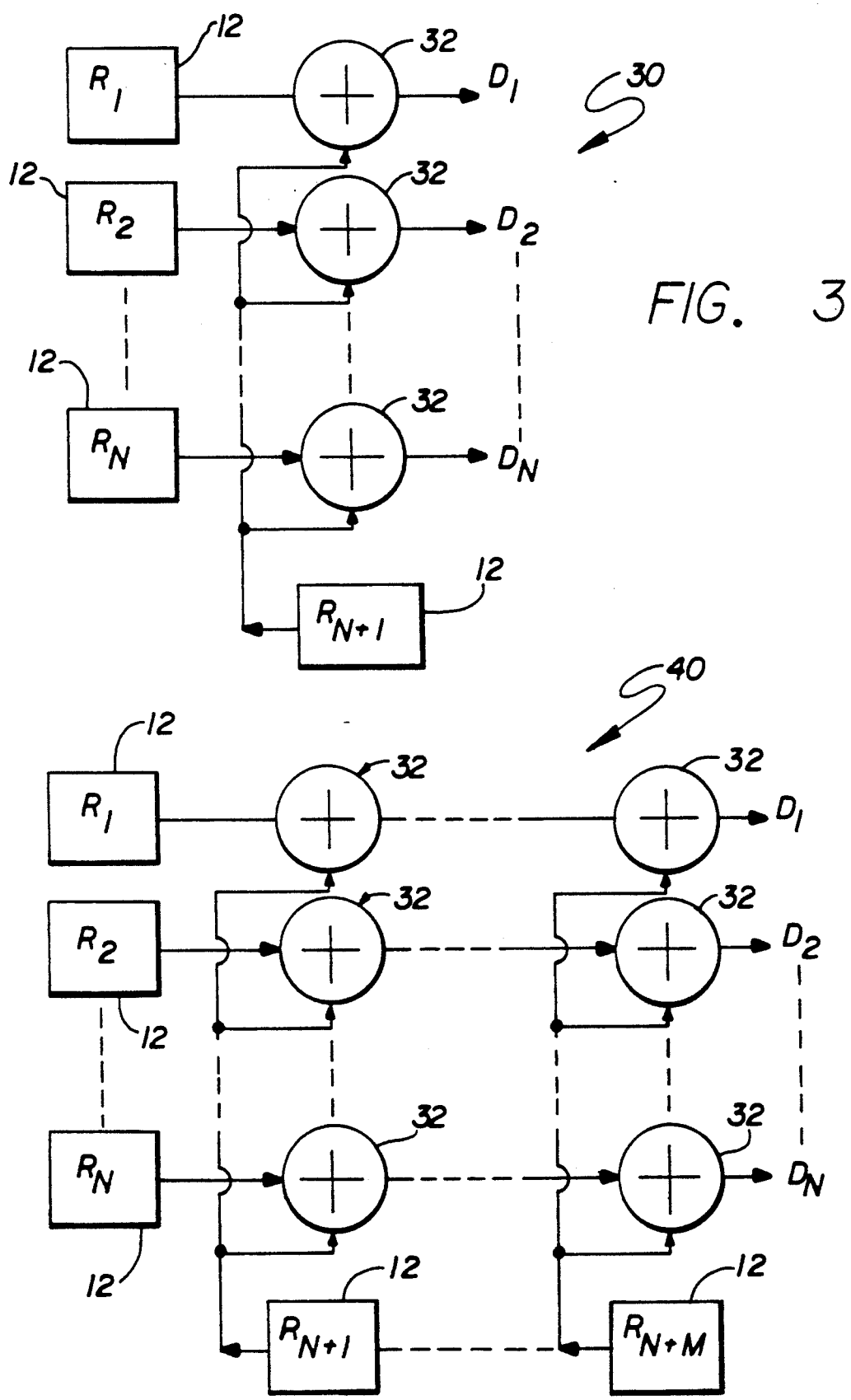
FIG. 3 is an illustrative embodiment of the improved high speed word generator of the present invention with a one fold assymmetry sensitivity reduction utilizing N+1 one bit white noise generators.
FIG. 4 is an alternative embodiment of the high speed word generator of the present invention with an M fold asymmetry sensitivity reduction using N+1 one bit white noise generators.

An illustrative embodiment of the high speed word generator of the present invention is shown in FIG. 3.

The invention 30 includes N+1 one bit white noise generators 12, and N exclusive or (XOR) gates 32. While the functions of the XOR gates 32 may be implemented with off-the-shelf components (e.g., SN7486's), it is understood that any device with a comparable truth table may be used without departing from the scope of the invention. Each gate 32 receives input from two one bit white noise generators 12. Thus, the outputs of the one bit white noise generators 12 are exclusive "or"ed with one another. It is believed that the use of the XOR gates 32 provides a reduction in sensitivity to the probability asymmetry d of the individual one bit white noise generators 12 and that it can be shown that the one bit probability asymmetry of the XORed output becomes $2d^2$. Thus, the maximum variance of the relative probabilities of the word values becomes:

$$E=2N(2d)^2=8Nd^2.$$

Since one stage of XOR operations is used in the embodiment of FIG. 3, it can be said that the embodiment offers a one fold asymmetry sensitivity reduction utilizing N+1 one bit white noise generators. As shown in FIG. 4, the process can be repeated $M-1$ times making a high speed word generator 40 with M stages of XOR gates 32 and therefore an M fold asymmetry sensitivity reduction. This M fold asymmetry reduction process produces a one bit output probability asymmetry of $d(2d)^{M-1}$ making the maximum variance $$E=2N(2d)^M.$$

Figure 5:
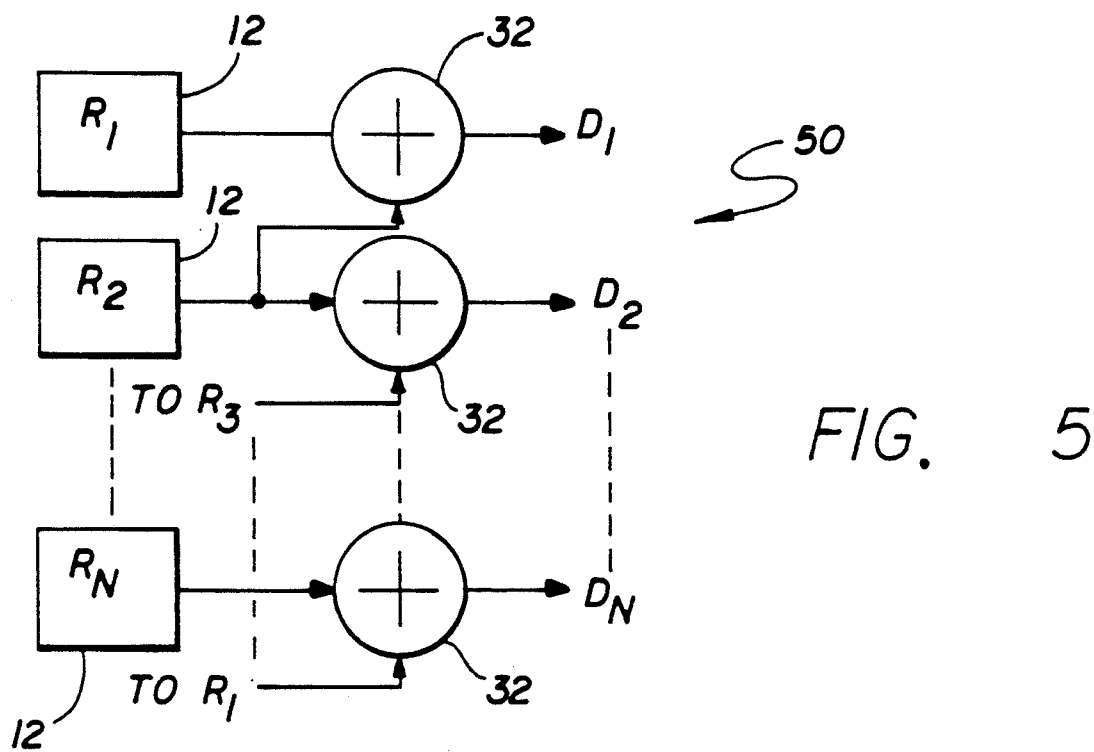
FIG. 5 is an alternative embodiment of the high speed word generator of the present invention with a one fold asymmetry sensitivity reduction using N one bit white noise generators.

For $N\geq 3$ FIG. 5 shows an alternative embodiment of the improved high speed word generator 50 of the present invention with a one fold asymmetry sensitivity reduction using only N one bit white noise generators. In this case, even though adjacent outputs are XORed, it may be shown that the XORed outputs are at least as statistically independent as the original generators.

Figure 6:
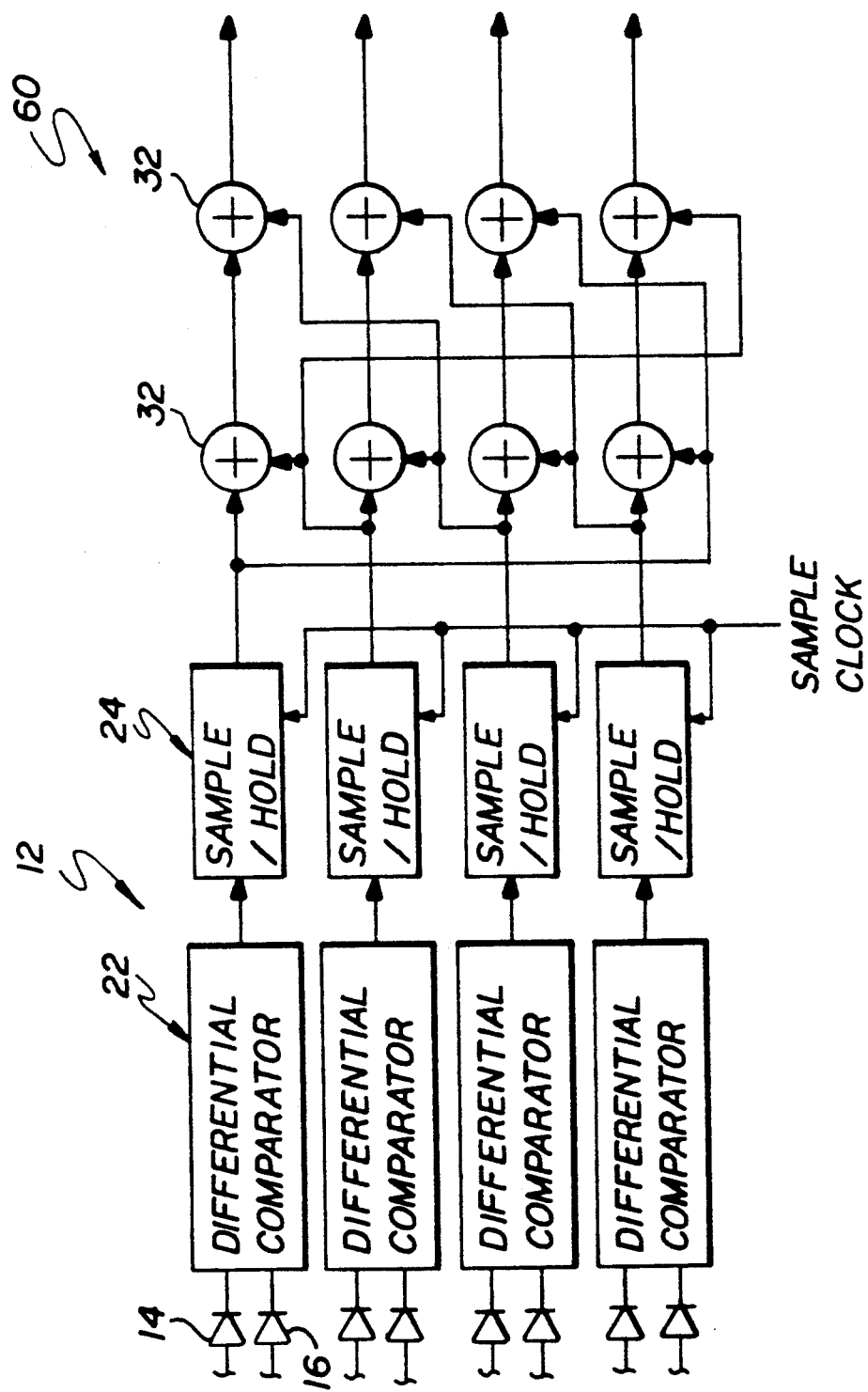
FIG. 6 is an illustrative embodiment of the high speed word generator of the present invention with a three fold asymmetry sensitivity reduction using four one bit white noise generators.

Similarly, by XORing more than two outputs, one can achieve higher order asymmetry sensitivity reduction without increasing the number of one bit white noise generators 12. Thus, for an N bit word generator, one can achieve a maximum of $N-1$ fold asymmetry sensitivity reduction by XORing the N combinations of $N-1$ statistically independent outputs. This requires $N(N-2)$ XOR gates 32 as well as N one bit white noise generators 12. An example of a four bit high speed word generator 60 with three fold asymmetry reduction is shown in FIG. 6 where the one bit white noise generators 12 are shown in greater detail.

Figure 7:
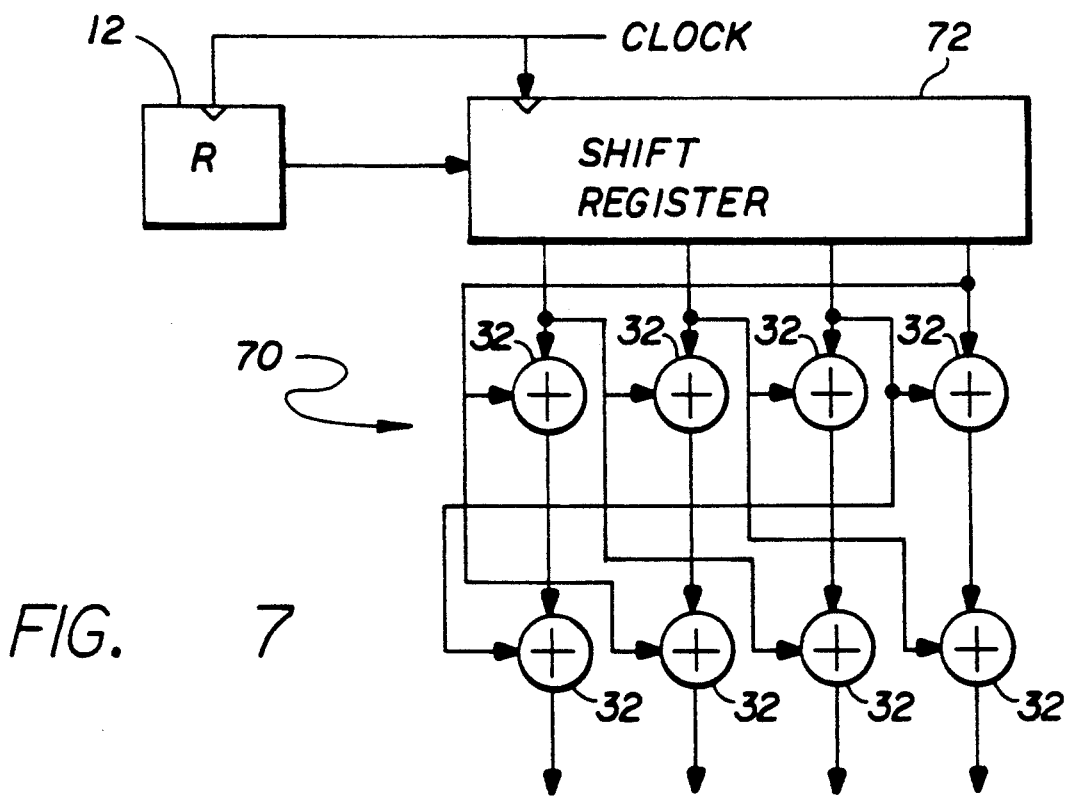
FIG. 7 is a alternative embodiment of the high speed word generator of the present invention with a two fold asymmetry sensitivity reduction utilizing a single one bit white noise generator.

For lower speed applications, the embodiment 70 of FIG. 7 might be preferred. In FIG. 7 a shift register 72 is used to store plural outputs of a single one bit white noise generator 12. The plural outputs are then provided in parallel to the stages of XOR gates as discussed above.

Thus, the present invention has been described herein with reference to illustrative embodiments for a particular application. It is understood that those of ordinary skill in the art will recognize additional modifications, applications and embodiments within the scope of the invention. For example, as mentioned above, the XOR operation may be performed by any device, including a digital computer, which provides the same XOR truth table. The device used to generate one bit inputs to the XOR device is not critical, so long as devices of nominal probability distribution asymmetry are used. In addition, within the teachings provided herein, the invention is not limited to any particular arrangement, number or combination of one bit white noise generators and XOR gates.

It is intended by the appended claims to cover any and all such modifications, applications and embodiments.

Accordingly,

What is claimed is:

1. An improved N-bit high speed word generator comprising:

noise generator means for providing N bits, said noise generator means including N one bit noise generators where N is an integer greater than 2: and Exclusive OR (XOR) means including N×M Exclusive OR gates arranged in M stages, where M is an integer greater than 1, for providing M stages of N output signals, each of said gates in the first of said M stages being coupled to two of said N one bit noise generators, the first stage providing N output signals each of which is the Exclusive OR of two of said bits from said noise generator means; and each said Exclusive OR gates of the subsequent stages being coupled to the output of a respective Exclusive OR gate of the previous stage and an output of said noise generator means, such that the output of the last of said M stages provides N output signals.

2. An improved N-bit high speed word generator comprising:

white noise generator means for providing N bits, where N is an integer greater than 2, said noise generator means including a one bit noise generator and means for storing the output thereof; and Exclusive OR (XOR) means including N×M Exclusive OR gates arranged in M stages, where M is an integer genator than 1, for providing M stages of N output signals, each of said gates in the first of said M stages being coupled to two of said N one bit noise generators, the first stage providing N output signals each of which is the Exclusive OR of two of said bits from said noise generator means; and each said Exclusive OR gates of the subsequent stages being coupled to the output of a respective Exclusive OR gate of the previous stage and an output of said noise generator means, such that the output of the last of said M stages provides N output signals.

3. A method for generating an N-bit high speed word including the steps of:

a) providing N substantially random bits where N is an integer greater than 2;

b) providing N first output signals, each of which is the Exclusive OR of two of said bits; and c) providing N second output signals, each of which is the Exclusive OR of one of said first output signals and one of said bits.

4. An improved N-bit high speed word generator comprising:

noise generator means for providing N bits, said noise generator means including N one bit noise generators where N is an integer greater than one;

a first additional one bit noise generator;

Exclusive OR means including a first set of N Exclusive OR gates each coupled to one of said N one bit noise generators and said first additional one bit noise generator whereby said first set of gates produces N output signals providing an N-bit word.

5. The improved N-bit high speed word generator of claim 4 and further including a second additional one bit noise generator and said Exclusive OR means including a second set of N Exclusive OR gates wherein each of said second set of gates is coupled to a respective one of the first set of gates and to said second additional one bit noise generator whereby said second set of gates produces N output signals providing an N-bit word.

* * * * *